United States Patent [19]

Yamashita et al.

[11] Patent Number: 5,303,482

[45] Date of Patent: Apr. 19, 1994

[54] WAFER AIRTIGHT KEEPING UNIT AND KEEPING FACILITY THEREOF

[75] Inventors: Teppei Yamashita; Masanao Murata; Tsuyoshi Tanaka; Teruya Morita; Hitoshi Kawano; Atsushi Okuno; Masanori Tsuda; Mitsuhiro Hayashi; Hiromi Morita, all of Ise, Japan

[73] Assignee: Shinko Electric Co., Ltd., Tokyo, Japan

[21] Appl. No.: 826,954

[22] Filed: Jan. 28, 1992

[30] Foreign Application Priority Data

Jan. 29, 1991 [JP] Japan ................................ 3-009401
Jan. 29, 1991 [JP] Japan ................................ 3-009404
Oct. 17, 1991 [JP] Japan ................................ 3-269781

[51] Int. Cl.$^5$ ............................................. F26B 21/06
[52] U.S. Cl. ............................................. 34/80; 34/218; 34/36
[58] Field of Search .................... 34/36, 37, 32, 218, 34/219, 223, 224, 225, 22, 23, 80, 82, 202

Primary Examiner—Henry A. Bennett
Attorney, Agent, or Firm—Flynn, Thiel, Boutell & Tanis

[57] ABSTRACT

A wafer keeping apparatus includes a closed wafer keeping space, and an arrangement for circulating an inert gas through a filter and then through the wafer keeping space. In one embodiment, several wafer keeping shelves are each provided within the space, and the inert gas is supplied through a respective filter to flow across each shelf. In another embodiment, a plurality of wafer keeping spaces are each accessible through a respective door which forms an airtight seal when it is closed, and respective filters are provided on opposite sides of the space, the inert gas being supplied to the space through one filter and exiting the space through the other filter. In a further embodiment, several of the wafer keeping spaces are provided at angularly and vertically spaced locations in a rotatable stocker body provided within a casing, and several vertically spaced doors are provided on the casing to provide access to respective wafer keeping spaces in the stocker body.

12 Claims, 13 Drawing Sheets

WAFER AIRTIGHT KEEPING UNIT AND KEEPING FACILITY THEREOF

BACKGROUND OF THE INVENTION

1. Field of the Invention

The present invention relates to a wafer airtight keeping unit and a facility thereof for keeping temporarily a wafer cassette in a clean room for handling a semiconductor wafer.

2. Prior Art

A conventional article keeping facility in a clean room is disclosed in Japanese Publication Patent No. 1-41561. The article keeping facility comprises article keeping shelves having a plurality of partitioned accommodating spaces arranged vertically and laterally and a loading apparatus provided with an article taking-in-and-out mechanism which is movable vertically and laterally along a given route which is laid out on a central passage arranged between the article keeping shelves.

The article keeping facility of this type is provided with an air supply device, which is disposed under the article keeping shelves, and the air supplied from the air supply device is cleaned through a filter and blown from the rear side of the article keeping shelves toward the loading apparatus so that dust is prevented from floating or staying at the side of the article keeping shelves.

Since the loading apparatus mounts a lifting guide device and a lifting driving device for guiding the article taking-in-and-out mechanism on its self-propelled carriage, dust is generated due to abrasion and spreads toward the article keeping shelves and attached to the semiconductor wafers etc. without drawing the dust under the floor side and removed therefrom. Accordingly, it is necessary to entirely cover both the lifting guide device and the lifting driving device while an air suction device is mounted at the lower side of the self-propelled carriage, whereby the dust generated within the cover is drawn downward and removed by the air suction device through the floor of the carriage.

As mentioned above, the floating dust is prevented from attaching to the articles (semiconductor wafers accommodated in wafer cassettes) on the article keeping shelves by forming a clean air current from the rear portion of the article keeping shelves toward the central passage.

As is evident from the conventional article keeping facility, a measure to prevent the dust is taken since the semiconductor wafer is apt to be easily damaged by the dust. However, it is also necessary to take into consideration formation of an oxide film caused by a spontaneous oxidation of a semiconductor IC involved in high integration of the semiconductor IC.

FIGS. 14 and 15 are graphs disclosed in the "Super LSI ultra clean technology symposium" (Nov. 19, 1990) which FIG. 14 shows a relation between an oxide thickness and time involved in forming of the oxide film on the surface of a silicon semiconductor wafer caused by spontaneous oxidation and FIG. 15 shows a relation between resistivity and time involved in forming oxide film. FIG. 14 shows that growth rate of the oxide film is increased after the lapse of 100 to 200 minutes while FIG. 15 shows that resistivity is abruptly increased in the situation of non-cleaning of the IC after the lapse of about 50 minutes.

There is such a problem that high integrated IC is difficult to be manufactured because the oxide film is generated thereon by the spontaneous oxidation since the semiconductor wafer is normally kept for several hours to several days.

As the semiconductor integrated circuit is further advanced to high integration, it is necessary to convey and move the wafer in the atmosphere of inert gas such as $N_2$ gas for restricting the oxide film caused by the spontaneous oxidation from growing. At present, the $N_2$ gas atmosphere is required to have a concentration of at least 10 ppm of $O_2$ and 100 ppm of $H_2O$.

To meet the demand of this atmosphere, the process of manufacturing a semiconductor device, which is conventionally carried out in a specific design clean room, has come to employ a mechanical interface device which is disclosed in Japanese Laid-Open Publication Patent No. 60-143623 in which the semiconductor device is manufactured under the $N_2$ gas atmosphere.

Accordingly, it is necessary to keep temporarily therein the keeping unit (stocker), which keeps the semiconductor wafer always under the $N_2$ gas atmosphere during the process of manufacturing the semiconductor device.

However, the conventional stocker provided with a door is not airtight enough against a surrounding atmosphere so that an entire stocker per se communicates with the surrounding atmosphere every time the door is open, therefore, a large amount of $N_2$ gas had to be introduced into the stocker every time the stocker communicates with the surrounding atmosphere. Accordingly, there was a problem that a turbulence is generated in the stocker every time the large amount of $N_2$ gas is introduced into the stocker, which permits the dust in the stocker to float in the air, permits a concentration of the $N_2$ gas in each cassette housing room nonuniform and make the arrangement of the stocker complex and large sized.

It is therefore a first object of the present invention to provide a wafer keeping facility which is capable of restraining the growth of the oxide film caused by the spontaneous oxidation during the keeping of the ICs.

It is a second of the present invention to provide a wafer airtight keeping unit which is capable of airtightly sealing the unit except a cassette housing room against an external atmosphere when a wafer cassette is taken in and out from the unit, and is capable of restricting the $N_2$ gas concentration from varying and the dust from floating in the other portions of wafer airtight keeping unit when the cassette is taken in and out from the unit, for thereby increasing the manufacturing yield of the semiconductor device compared with the conventional unit.

PREFERRED EMBODIMENT OF THE INVENTION

Figure 1:
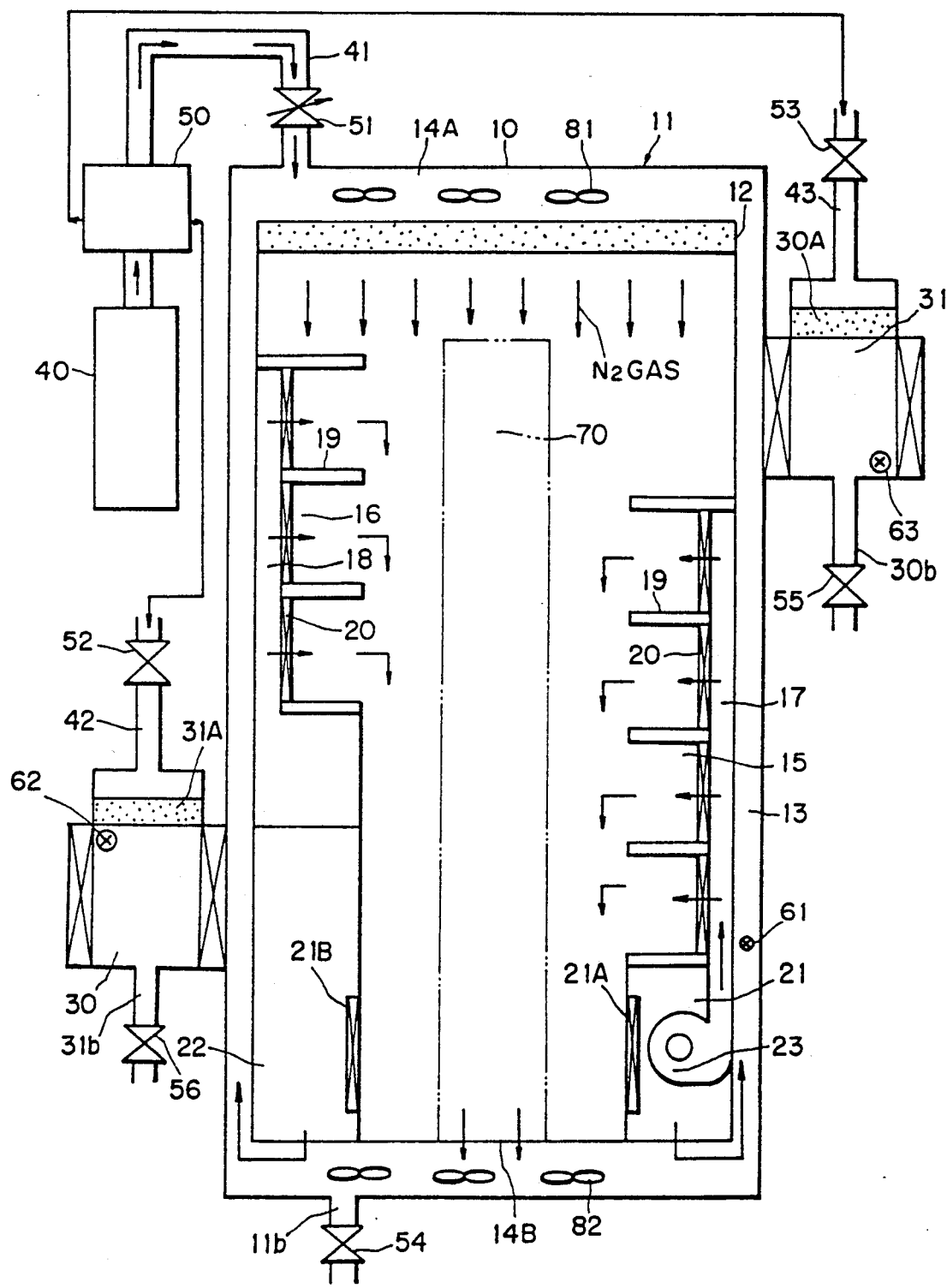
FIG. 1 is a longitudinal cross-sectional view of a wafer airtight keeping unit and a keeping facility according to a first embodiment of the present invention.
Figure 2:
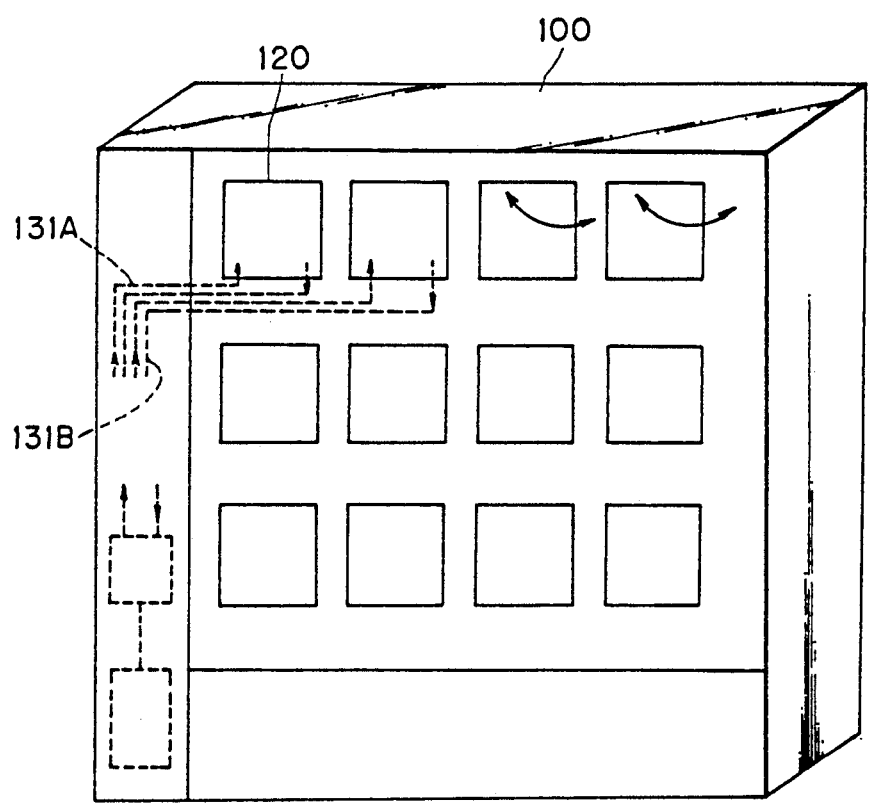
FIG. 2 is a front view of a wafer airtight keeping unit and a keeping facility according to a second embodiment of the present invention.

First Embodiment (FIG. 1)

A wafer keeping facility according to a first embodiment will be described with reference to FIG. 1.

Denoted at 10 is a wafer keeping box which has a double structured wall, i.e. an outer wall 11 and an inner wall 12. A space 13 is defined between the outer and inner walls 11 and 12. A wafer keeping room 14 is defined by a space surrounded by the inner wall 11. The wafer keeping room 14 has a filter wall 14A at a ceiling thereof and suction wall 14B at a bottom thereof. The wafer keeping box 10 has an exhaust outlet 11B at the bottom of the outer wall 11. Wafer keeping shelves 15 and 16 are provided at the right and left wall surfaces of the wafer keeping room 14 in which fluid passages 11 and 18 are defined between the rear portions of the wafer keeping shelves 15 and 16 and the inner wall 12. The wafer keeping shelves 15 and 16 has a plurality of partitioned shelves 19 for accommodating wafer cassettes. A plurality of filters 20 are provided between partitioned shelves 19 and the fluid passage 17 or 18 serving as partitions. Spaces 21 and 22 are partitioned under the wafer keeping shelves 15 and 16 for communicating with the fluid passages 11 and 18 in which a circulating pump 23 is disposed in the space 21. Likewise, the same circulating pump, not shown, is disposed in the space 22. Denoted at 30 is a first path box provided at a first taking-in-and-out outlet and 31 is a second path box provided at a second taking-in-and-out outlet and filters 30A and 31A are disposed on each ceiling of the first and second path boxes 30 and 31 and exhaust outlets 30B and 31B are disposed on the bottom walls of the first and second path boxes 30 and 31.

Denoted at 40 is an inert gas reservoir such as an $N_2$ gas cylinder for storing inertia gas such as $N_2$ gas and 50 is a fluid control device. Denoted at 41 is a first gas supply pipe which extends from the inert gas reservoir 40 toward the ceiling of the wafer keeping box 10 and opens inside the space 13 between the outer and inner walls 11 and 12. Denoted at 51 is a variable fluid valve. Denoted at 42 is a second gas supply pipe which extends from the inert gas reservoir 40 over the inlet side path box 30. Denoted at 52 is an ON/OFF valve. Denoted at 43 is a third gas supply pipe which extends from the gas reservoir 40 above the outlet side path box 31. Denoted at 53 is an ON/OFF valve. Denoted at 54, 55 and 56 are normally closed valves.

Denoted at 61 is a first oxide concentration meter in the wafer keeping box 10. Denoted at 62 is a second oxide concentration meter in the inlet side path box 30. Denoted at 63 is a third oxide concentration meter in the outlet side path box 31.

The fluid control device 50 receives signals issued by the first to third oxide concentration meters 61, 62 and 63 and controls the degree of opening of the valve 51 depending on the difference between measured value and reference value of the first oxide concentration meter 61 and opens the valves 52 and 53 for a prescribed time at intervals of a given time.

Denoted at 70 is a loading apparatus such as a stacker crane which travels along a rail provided on the floor along the central passage.

Denoted at 81 is a blowing fan and 82 is a suction fan.

With the arrangement set forth above, air in the first inlet side path box 30, and the second outlet side path box 31 is replaced by $N_2$ gas. Valves 51, 52 and 53 are full opened so that $N_2$ gas is supplied from the inert gas reservoir 40, through the first to third gas supply pipes 41, 42 and 43, into the wafer keeping box 10, the inlet side inlet side path box 30 and the outlet side outlet side path box 31. $N_2$ gas supplied in the wafer keeping box 10 passes the filter wall 14A of the wafer keeping box 10 and is introduced into the wafer keeping room 14 to fill the wafer keeping room 14 and thereafter passes to the space 13 from the suction wall 14B of the wafer keeping room 14. Accordingly, air in the wafer keeping box 10 is expelled from the valve 54 and is replaced by $N_2$ gas. Air in the inlet side path box 30 and the outlet side path box 31 is also expelled from the valves 55 and 56 by $N_2$ gas which is introduced through the filters 30A and 31A and is replaced by $N_2$ gas.

When air in the wafer keeping box 10, the inlet side path box 30 and the outlet side path box 31 is successively replaced by $N_2$ gas and concentration of oxide is lowered under a prescribed value, the fluid amount control device 50 closes the valves 51, 52 and 53. At this time, the valves 54, 55 and 56 are also closed. Thereafter, when the concentration of the oxygen in the wafer keeping box 10 exceeds the prescribed value, the fluid amount control device 50 controls the degree of opening of the valve 51 to thereby quickly fill $N_2$ gas in the wafer keeping box 10 so that concentration of oxygen is kept below the prescribed value. The valves 52 and 53 are opened for a prescribed time at intervals of a given time so that the inlet side path box 30 and the outlet side path box 31 are regularly filled by $N_2$ gas.

The circulating pumps 23 and 24 are operated in the wafer keeping room 10 so that $N_2$ gas circulates in the route extending from the fluid passages 17 and 18, the filters 20, the partitioned shelves 19, the central portion of the wafer keeping room, the bottom of the wafer keeping room 10, the filters 20 and spaces 21 and 22, hence the dust is prevented from entering the partitioned shelves 19. Inasmuch as $N_2$ gas is filled in the inlet side path box 30 and the outlet side path box 31, concentration of oxygen in the wafer keeping box 10 is not liable to increase whenever the wafer cassettes are taken in or out so that concentration of $N_2$ gas is always kept constant in the wafer keeping room 10.

The valves 52 and 53 may be opened only when the wafer cassette is taken in although they are opened for a prescribed time at intervals of a given time, i.e. under a time control, or may be opened or closed depending on the concentration of oxygen.. On the contrary, the valve 51 may be under time control too.

With the arrangement of the first embodiment, it is possible to restrict the oxide film from growing on the surface of the semiconductor wafer due to spontaneous oxidation since the wafer keeping room is always filled by inert gas and also possible to prevent dust from attaching to the semiconductor wafer kept on the partitioned shelves since air current of inertia gas is flowing from the rear portions of the partitioned shelves of the wafer keeping room toward the loading apparatus.

Second Embodiment (FIGS. 2 to 5)

A wafer airtight keeping unit according to a second embodiment will be described with reference to FIGS. 2 to 5.

Figure 3:
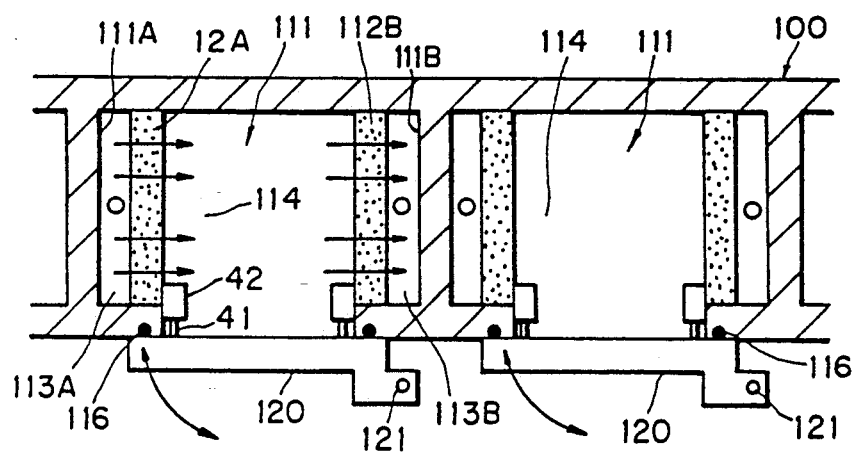
FIG. 3 is a lateral cross-sectional view of a partitioned room according to the second embodiment.

A wafer keeping unit 100, which is provided in a wafer keeping box, has a plurality of boxed shaped partitioned rooms 111 for accommodating wafer cassettes therein, as illustrated in FIG. 3. The partitioned rooms 111 are arranged vertically and laterally and open at the front sides thereof (at the side from which the wafer cassettes are taken in and out by the loading apparatus) which are provided with front doors 120.

The partitioned room 111 has a filter 112A and a fluid passage 113A, which is defined between a left wall 111A and the filter 112A and also has a filter 112B and a fluid passage 113B, which is defined between a right wall 111B and the filter 112B. A wafer accommodating space (from which the wafer cassettes are taken in and out) is defined between both the filters 112A and 112B.

Figure 4:
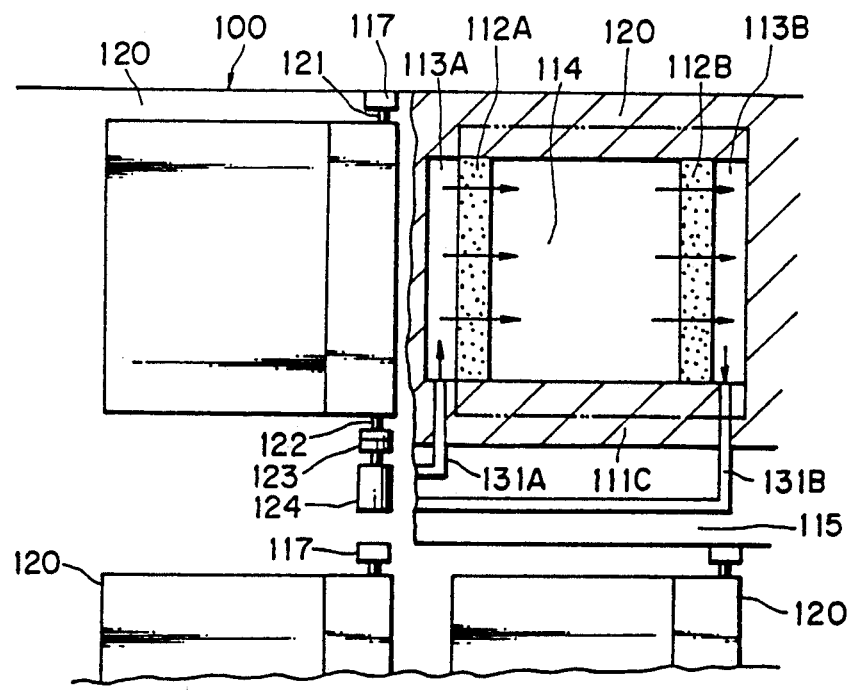
FIG. 4 is a longitudinal cross-sectional view of the partitioned room according to the second embodiment.
Figure 5:
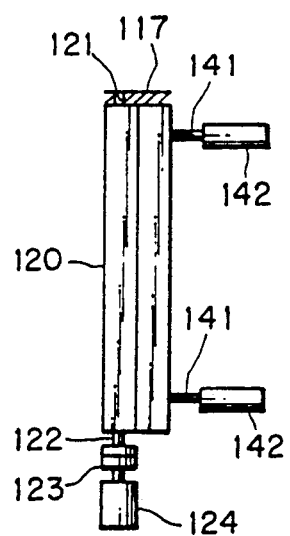
FIG. 5 is a view of a front door of the partitioned room as viewed from the lateral side.

A piping space 115 extends from a left wall 100A of the wafer keeping unit 100 to a right wall 100B of the same unit 100 between each wafer keeping shelf, as illustrated in FIG. 4. Disposed in the piping space 115 are a supply pipe 131A, which penetrates a bottom wall 111C of the partitioned room 111 and opens to the fluid supply passage 113A, and a gas discharge pipe 131B, which penetrates the bottom wall 111C of the partitioned room 111 and opens to the fluid discharge passage 113B. The gas supply pipe 131A is connected to an inert gas reservoir such as an $N_2$ gas cylinder which is disposed outside the wafer keeping unit 100, not shown, by way of a valve while a gas discharge pipe 131B opens outside the wafer keeping box by way of a discharge valve. A seal member 116 is provided at a periphery of each front door 120 of the partitioned room 111. The front door 120 has, as illustrated in FIGS. 4 and 5, shafts 121 and 122, which respectively extend from one side thereof. The shaft 121 is received by a receiving member 117 protruding from the partitioned room 111 while the shaft 122 is connected to a motor 124 by way of a coupling 123. Four magnetic pins 141 protrude from each corner of rear surface of the front door 120. Each magnetic pin 141 can be attracted by each electromagnetic solenoid valve 142 disposed inside each partitioned room 111. The magnetic pin 141 and the electromagnetic solenoid valve 142 constitute an automatic locking mechanism for airtightly closing the front door 120. A play is defined between the shaft 122 and the coupling 123.

In the arrangement of the second embodiment, air in all the wafer accommodating spaces 114 of all the partitioned rooms 111 is replaced by $N_2$ gas before the wafer keeping unit 100 is used. For replacing air by $N_2$ gas, the motor 124 of the front door 120 is driven to thereby close the front door 120 and to energize the electromagnetic solenoid valve 142 so that the automatic locking mechanism is operated. When the automatic locking mechanism is operated, the magnetic pin 141 is attracted toward the rear wall of the cassette accommodating space 114 so that the front door 120 is brought into strong contact with the opening of the partitioned room 111 by way of the seal member 116. As a result, the wafer accommodating space 114 is airtightly closed.

Successively, the valve in each gas supply pipe 131A is full opened and the valve in each gas discharge pipe 131B is full opened, whereby $N_2$ gas is supplied from the inert gas reservoir into the fluid passage 113A of the cassette accommodating space 114 through the gas supply pipe 131A. $N_2$ gas supplied to the fluid supply passage 113A is introduced into the wafer accommodating space 114 through the filter 112A to thereby fill the wafer accommodating space 114. Air occupied the wafer accommodating space 114 passes the filter 112B and is expelled toward the fluid discharge passage 113B and flown into the gas discharge pipe 131B. Air flown into the gas discharge pipe 131B is discharged outside the wafer keeping box so that air in the wafer accommodating space 114 is replaced by $N_2$ gas. After replacement of air by $N_2$ gas, all the valves are closed.

Since the concentration of $N_2$ gas in the wafer accommodating space 114 decreases as time passes, $N_2$ gas should be fresh supplied. To supply $N_2$ gas fresh, it is necessary to provide a fluid control devices for controlling the valves of the gas supply pipe 131A in the manner of opening the valves for a prescribed time at intervals of a given time, i.e. under the time control system or in the manner of opening the valves when the concentration of oxide in the cassette accommodating space 114 exceeds a prescribed value.

The wafer cassette is taken in the cassette accommodating space 114 or taken out from the cassette accommodating space 114 after opening the front door 120 by unlocking the automatic locking mechanism of a specified partitioned room 111 and driving the motor 124 of the front door 120.

It is possible to restrict oxidation of the semiconductor wafer from growing on the surface thereof when it is kept in the wafer accommodating room 114 since the wafer accommodating room 114 is under inert gas atmosphere excepting that the front door 120 is open.

Even in a power cut, the wafer accommodating room 114 is kept airtight, which does not influence the semiconductor wafers.

With the arrangement of the wafer airtight keeping unit according to the second embodiment, it is possible to restrict oxidation of the semiconductor wafer from growing on the surface thereof caused by spontaneous oxidation since each of the partitioned shelves of the wafer keeping units is provided with door which is not open excepting the wafer cassettes are taken in or out therethrough, hence the cassettes accommodating room is always under inert gas atmosphere Third Embodiment (FIGS. 6 to 15)

A wafer keeping facility according to a third embodiment will be described with reference to FIGS. 6 to 15.

Figure 6:
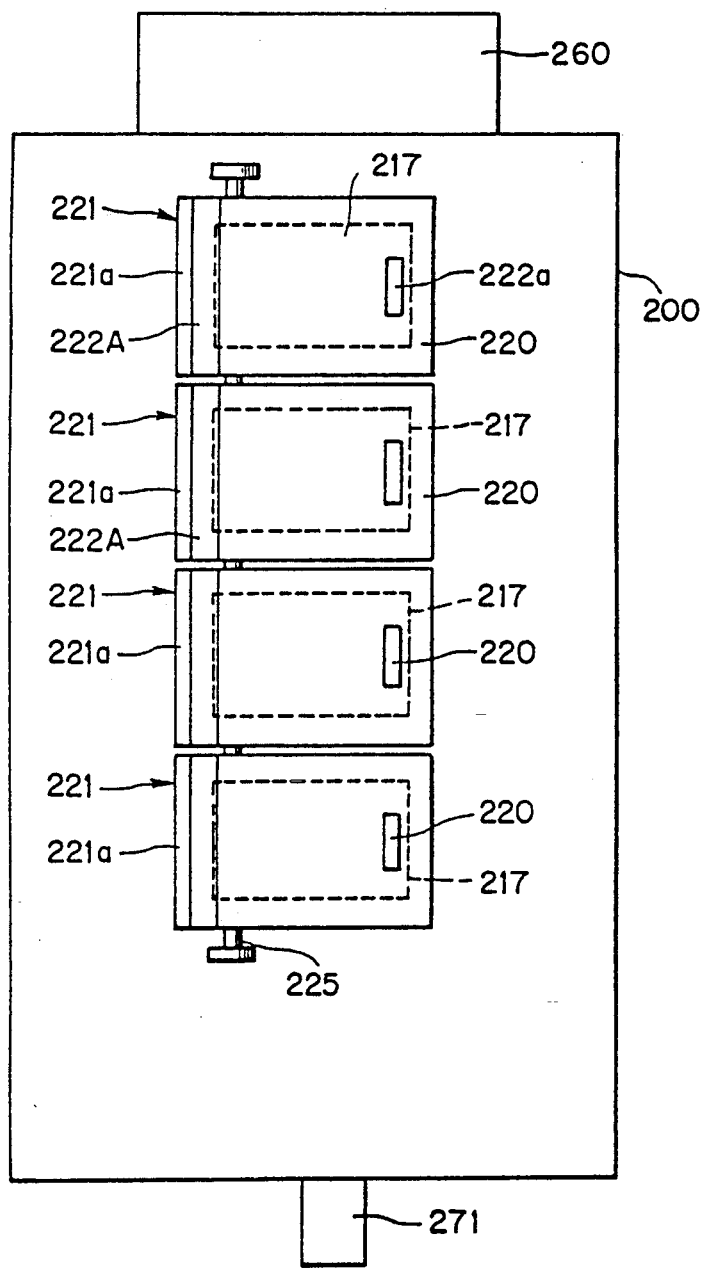
FIG. 6 is a front view of a wafer airtight keeping unit and a keeping facility according to a third embodiment of the present invention.
Figure 7:
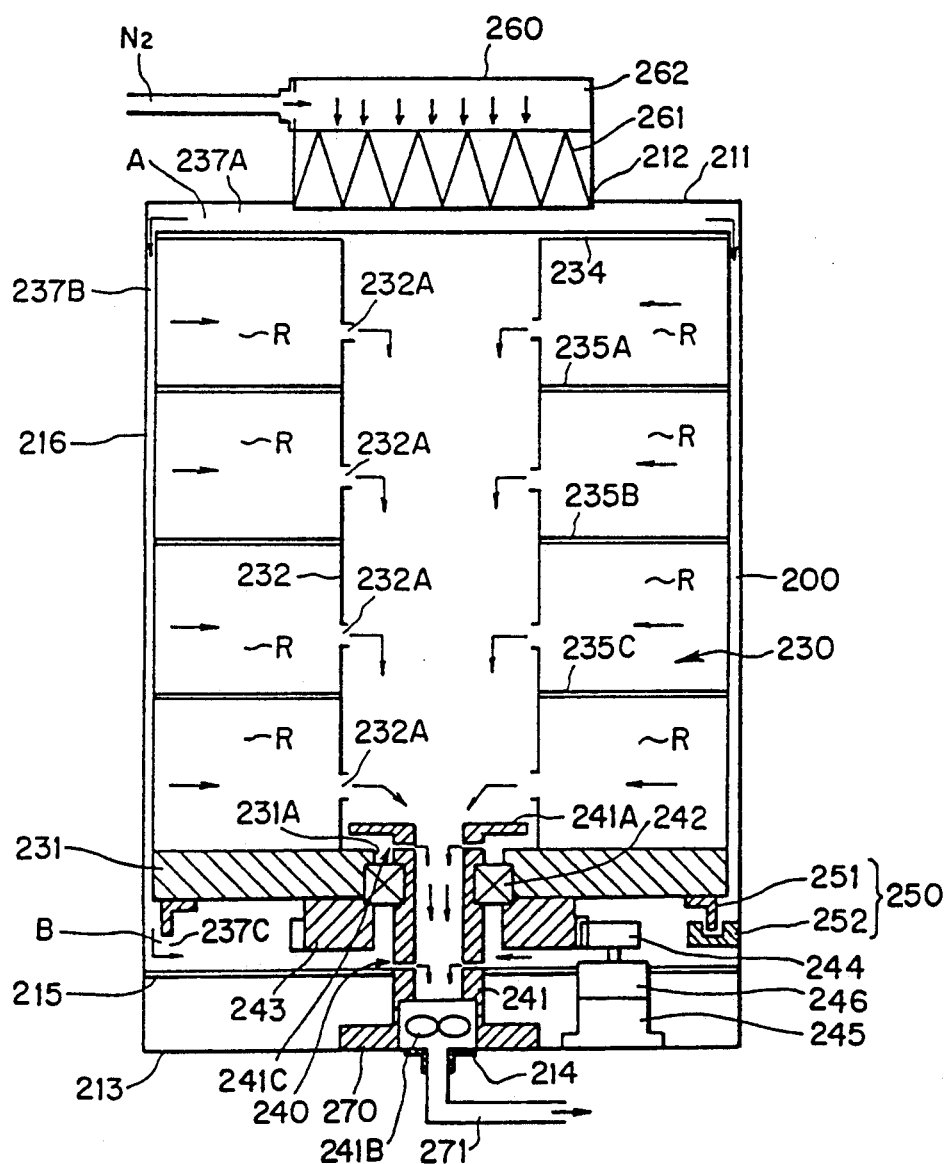
FIG. 7 is a longitudinal cross-sectional view of the third embodiment.
Figure 8:
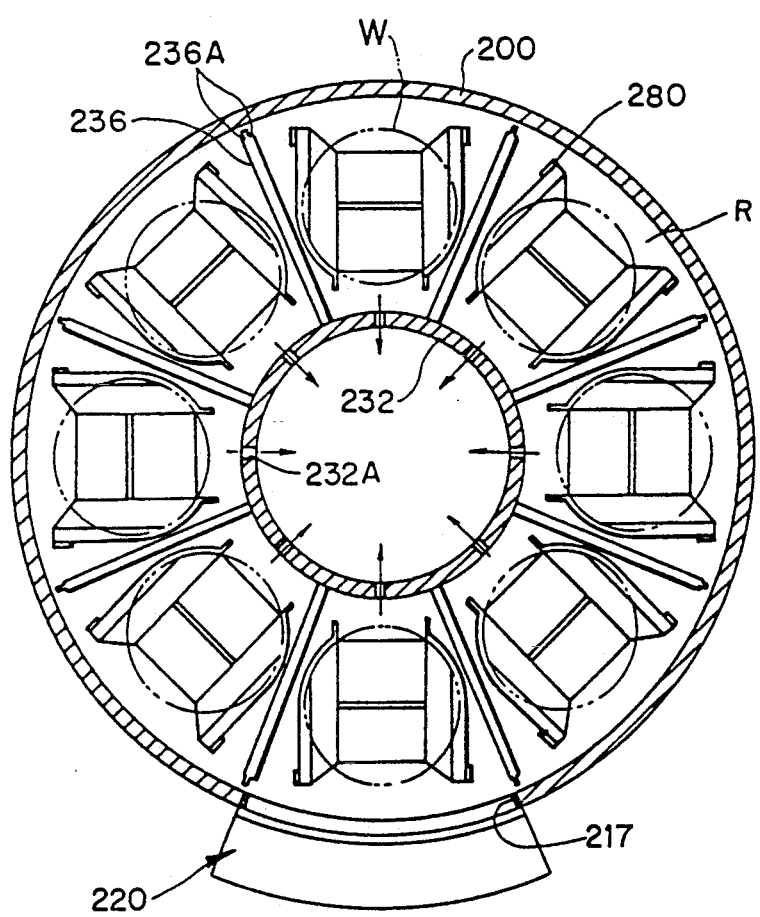
FIG. 8 is a lateral cross-sectional view of the third embodiment.

In FIGS. 6 to 8, a stocker casing 200 is cylindrical and houses plural rotary stocker bodies 230. The stocker casing 200 has a gas supply port 212 at its upper wall 211 and a gas discharge port 214 at its bottom wall 213. The stocker casing 200 is partitioned, by a partitioned table 215, which is disposed close to the bottom wall 213, into a half upper space A ($N_2$ gas purge space) for accommodating the rotary stocker bodies 230 and a half lower space B (a mechanism space) for accommodating a part of a driving mechanism of the rotary stocker bodies 230). Vertically arranged at one line on a peripheral wall 216 of the stocker casing 200 are set taking-in-and-out ports 217 which are normally airtightly closed by door bodies 222 of the door units 220.

The door units 220 will be described more in detail later with reference to FIGS. 9 to 11.

The stocker body 230 has a rotary table 231 having a central hole 231A and a hollow supporting shaft 232 coaxially provided with the rotary table 231. The supporting cylinder 232 has an inner space which forming air discharge space. The rotary table 231 is disposed on the bottom wall 213 of the stocker casing 200. The rotary table 231 is supported by a hollow fixed shaft 241 by way of a bearing 242. The fixed shaft 241 penetrates the partitioned table 215 and extends inside the supporting cylinder 232 through the central hole 231A of the rotary table 231. The rotary shaft 231 has an annular gear 243 which is attached to a lower surface thereof for constituting a turning force transmitting mechanism. A pinion 244 meshes with the gear 243. The pinion 244 is attached to the shaft of a motor 245, which is disposed at the lower space B, by way of a reduction gear 246. The fixed shaft 241 has a flange 241A at the upper end thereof, which serves as a guide plate, and an attaching flange 241B at the lower end thereof. Formed immediately under the flange 241A are a plurality of air discharge ports 241C, which open toward the upper surface of the rotary table 231 and a plurality of air discharge port 241D, which open between the partitioned table 215 and the rotary table 231.

The supporting cylinder 232 of the stocker body 230 has a ceiling plate 234 which is engaged with the upper end thereof. A plurality of circular shelf tables 235A, 235B and 235C, which respectively partition the interval between the ceiling plate 234 and the rotary table 231 successively in a predetermined interval. There are defined annular spaces between the supporting cylinder 232, the ceiling plate 234 and the shelf 235A; the supporting cylinder 232, the shelf 235A and the shelf 235B; the supporting cylinder 232, the shelf 235B and the shelf 235C; and the supporting cylinder 232, the shelf 235C and the rotary table 231. These annular spaces define a plurality of cassette accommodating rooms R by partitioned walls 236 which extend radially from the supporting cylinder 232 circumferentially in a predetermined interval. As shown in FIG. 8, the partitioned wall 236 each have tip end periphery edge thereof is recessed in L-shape at both surfaces thereof which form sealed portions 236A. The ceiling plate 234, the shelves 235A, 2353 and 235C and the rotary table 231 are respectively formed of circular plates having the same outer diameter, and have sealed portions 235a extending from the sealed portions 236A at the peripheral edges thereof.

The stocker body 230 has gas passages 237A, 237B and 237C which are successively partitioned between the upper wall 211 of the stocker casing 200, the peripheral wall 216 and the bottom wall 213 while the supporting cylinder 232 has gas discharge poles 232A which open toward each cassette accommodating room R. The opening sectional areas of the gas passages 232A are increased proportionally at a given ratio in the descending order.

Figure 9:
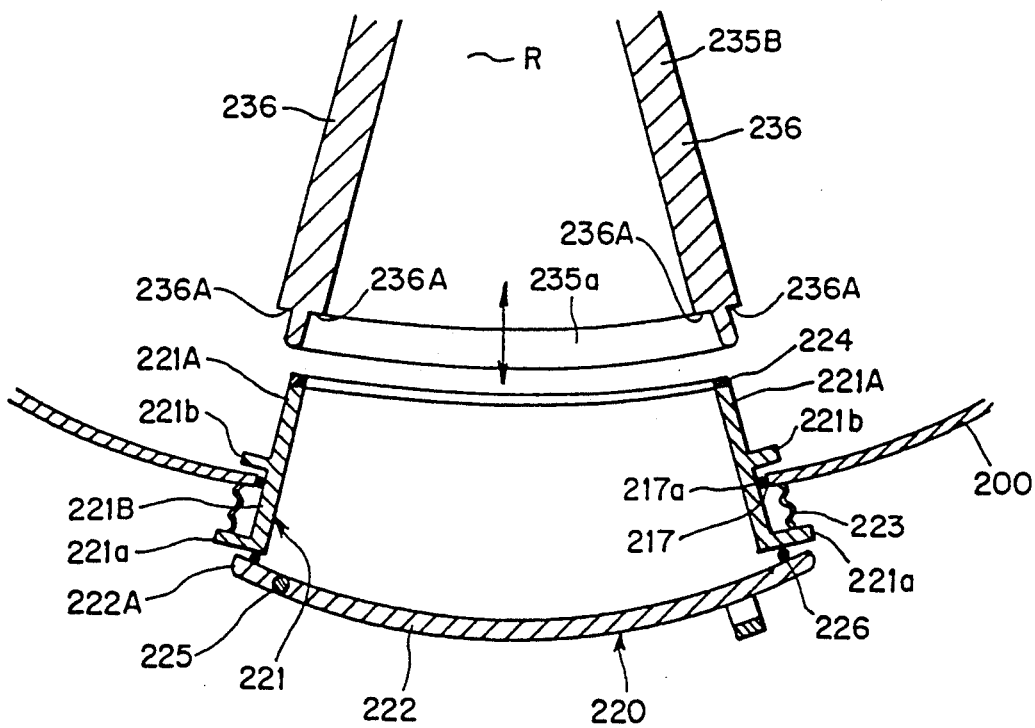
FIG. 9 is a cross-sectional view showing the arrangement of the surrounding of a door unit of the third embodiment.
Figure 10:
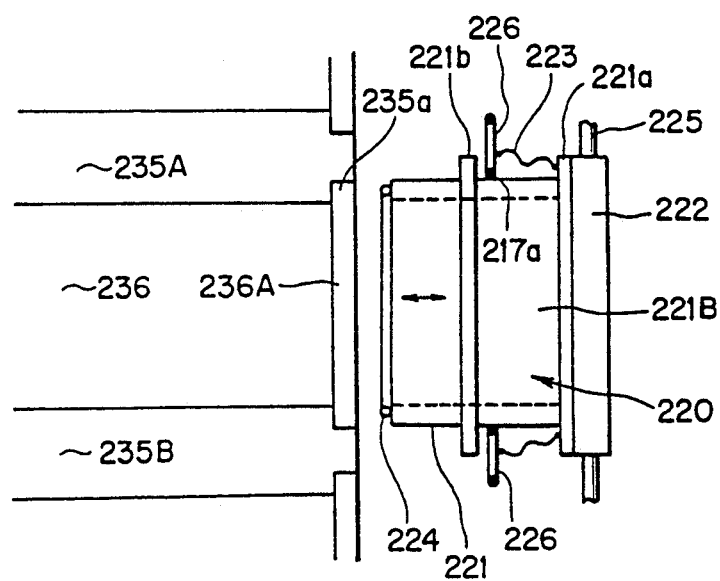
FIG. 10 is a cross-sectional view showing the arrangement of the surrounding of a door unit of the third embodiment.
Figure 11:
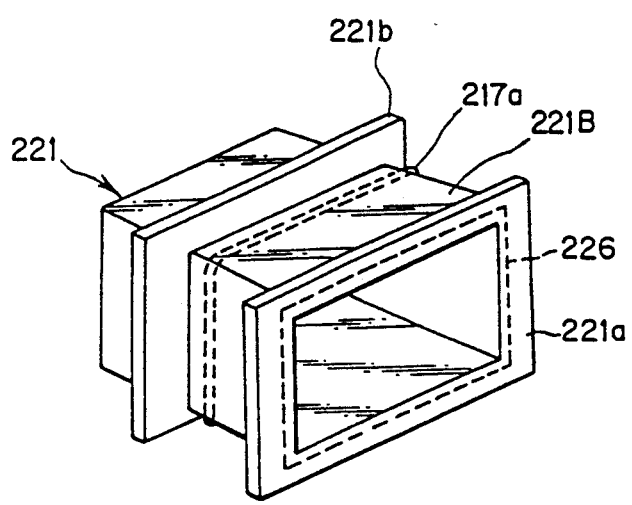
FIG. 11 is a view showing a movable frame of the door unit of the third embodiment.
Figure 12:
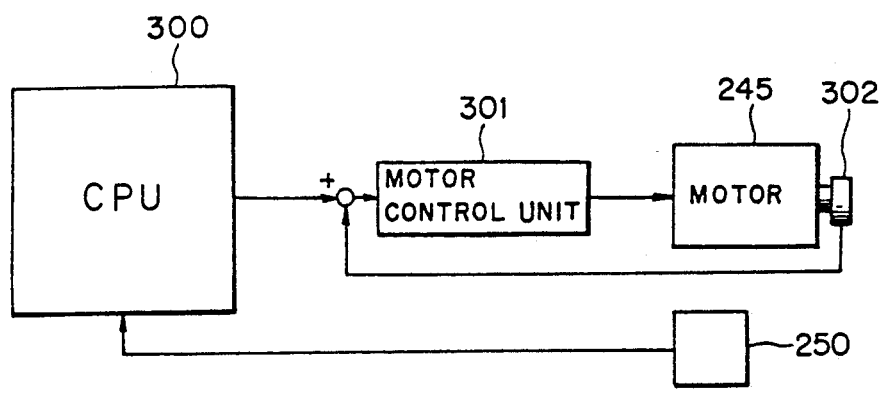
FIG. 12 is a view showing a signal route of the third embodiment.

The door units 220 each comprises, as illustrated in FIGS. 9 to 11, a rectangular movable frame (sliding frame), as viewed from the front thereof, which is engaged with the cassette taking-in-and-out port 217, and door body 222. Each of the sliding frame 221 has flanges 221a at an outer end thereof and collars 221b for defining guide grooves 221B to which end peripheral portions of the cassette taking-in-and-out port 217 are engaged. A space between an outer surface of the end peripheral portion and an inner surface of the flange 221a is sealed by a bellow 223 serving as a spring. The side frames 221A and 221a at the right and left sides of the sliding frame 221 have substantially the same angles as those defined between adjacent partitioned walls 236, so that inner end peripheries thereof can engage with the sealed portions 236A of the partitioned wall 236, and extend radially of the stocker casing 200. The inner end peripheries of the sliding frame 221 has ceiling members 224 which are attached at the entire peripheries thereof. The door bodies 222 are supported by hinge shafts 225 respectively fixed to the stocker casing 200 while side end portions of the hinge shaft 225 extend to lever portions 222A which engage with outer surfaces of the flange 221a. Denoted at 226 is a ceiling member attached to the outer surfaces of the flanges 221a and 222a is a knob of the door body 222. In FIGS. 7 and 12, denoted at 250 is a position sensor (a proximity switch) which comprises a dog 251 which is provided at the lower peripheral surface of the rotary table 231 in a predetermined interval in the circumferential direction thereof and a switch 252. The switch 252 detects the dog 251 whenever each cassette accommodating room R turns at a predetermined angular position and issues a door opening permission signal. The predetermined angular position corresponds to the position from which the cassette can be taken in and out, as illustrated in FIG. 9, where the right and left side frames 221A and 221a of the sliding frame 221 confront the sealed portion 236A of the adjacent partitioned walls 236 in the radial direction of the stocker casing 200.

Denoted at 260 is a gas supply chamber which is provided over the upper wall 211 of the stocker casing 200 and has a filter 261 for clogging the gas supply port 212. A chamber 262 communicates with a $N_2$ gas cylinder, not shown, by a pipe 263. Denoted at 270 is a discharge unit which communicates with the gas discharge port 214 and housed in a recess defined at the lower end portion of the fixed shaft 241. Denoted at 271 is a discharge pipe.

Denoted at 280 is a wafer cassette accommodating a semiconductor wafer W.

In FIG. 12, a motor 245 rotates or stops to rotate when a motor control unit 301 receives an instruction from a host control unit (CPU) 300. Denoted at 302 is an encoder. An output of an encoder, not shown, and the door opening permission signal from the position sensor 250 are respectively received by the host control unit (CPU) by way of the motor control unit 301. The CPU stores therein positions (addresses) of cassette accommodating rooms R and informations such as accommodation or non-accommodation of the wafer cassette 280 and record of the wafer cassette 280 and receives the door opening permission signal of the position sensor 250.

Figure 13:
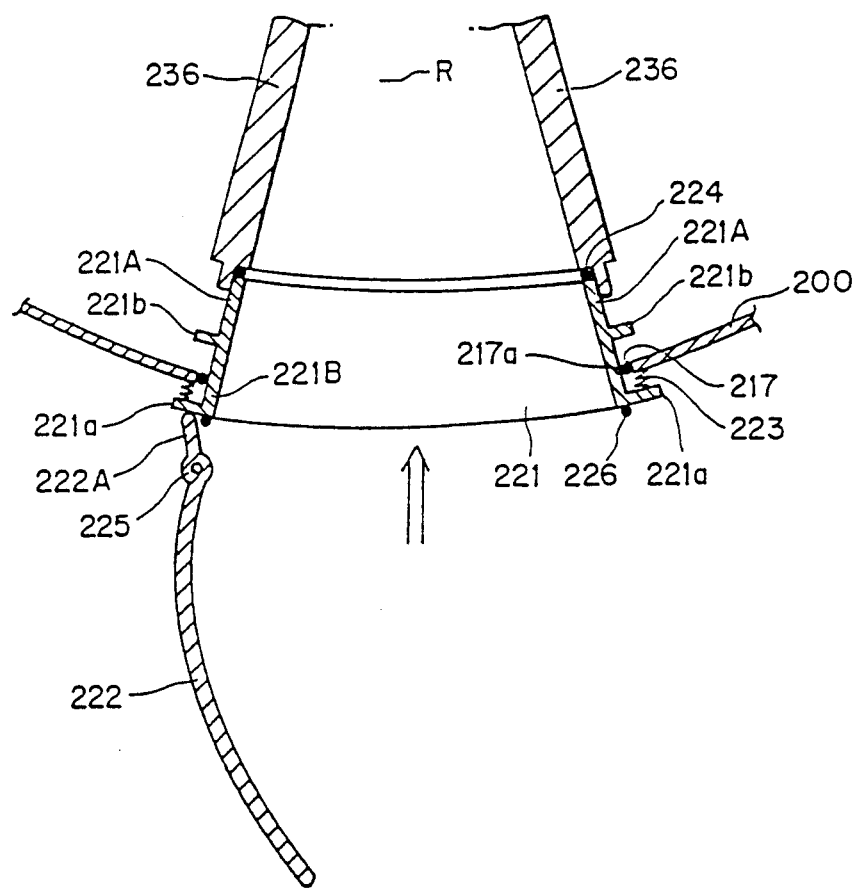
FIG. 13 is a view showing the state where a door is open.
Figure 14:
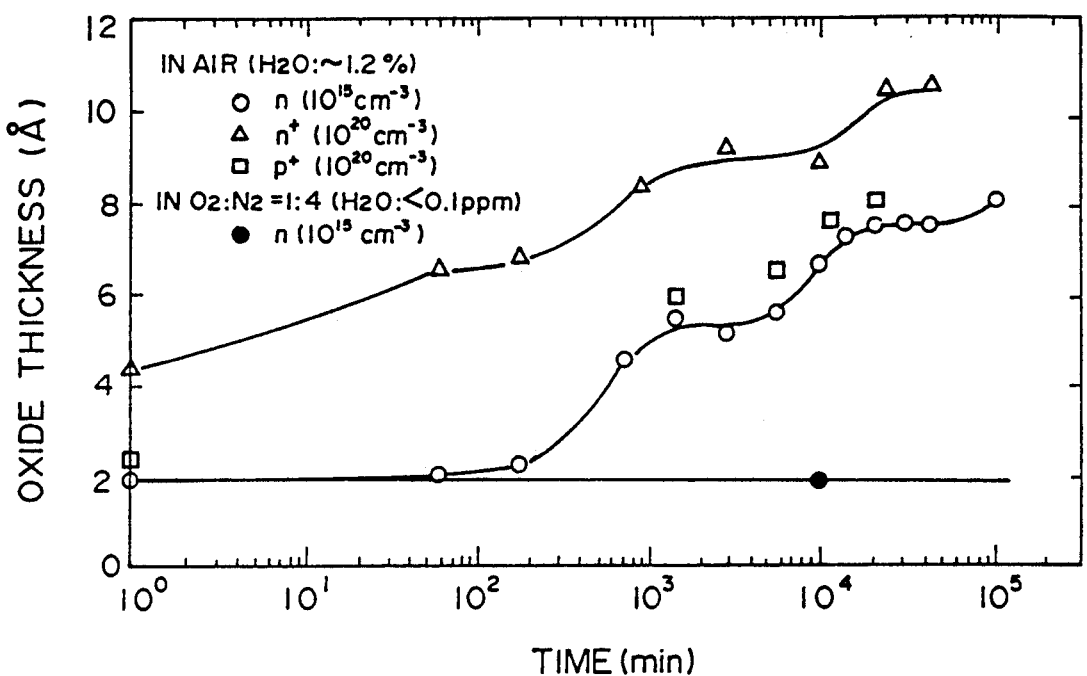
FIG. 14 is a view showing a relation between oxide thickness and time involved in forming an oxide film caused by spontaneous oxidation of a silicon semiconductor wafer.
Figure 15:
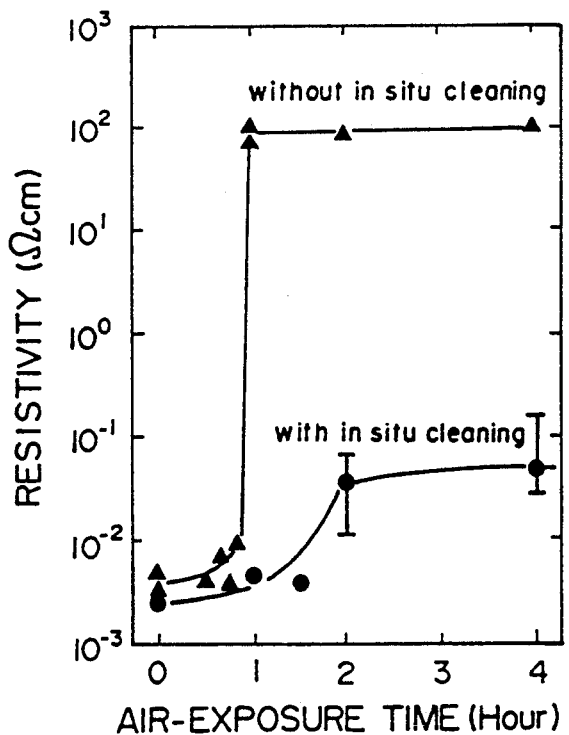
FIG. 15 is a view showing a relation between resistivity and time involved in forming an oxide film caused by spontaneous oxidation of a silicon semiconductor wafer.

According to the third embodiment, $N_2$ gas, which is supplied under high pressure from the gas cylinder, not shown, into the gas supply chamber 260, is supplied to the gas passage 237A of the stocker casing 200 through the filter 261. $N_2$ gas thus supplied to the gas passage 237A flows toward the gas passage 237B and further flows into each cassette accommodating room R, thereby fill the upper space A by $N_2$ gas. $N_2$ gas thus supplied to each accommodating room R is introduced into the supporting cylinder 232 through gas discharge ports 232A and further flows downward into the supporting cylinder 232. $N_2$ gas thus flows downward into the supporting cylinder 232 is drawn into the fixed shaft 241 and further flows downward thereinto, and finally discharged outside the clean room through the gas discharge port 214 and the discharge pipe 271. When the wafer cassette 280 is taken in and out from the wafer accommodating room R, the door body 222 is open at the time when the specified wafer accommodating room R is positioned in front of the cassette taking-in-and-out port 217A. When the door body 222 is pulled, the lever portion 222A pushes the sliding frame 221 in the radial direction of the stocker casing 200, as illustrated in FIG. 13, so that the sliding frame 221 is deviated toward the cassette accommodating room R. As a result, the sliding frame 221 is brought into contact with the seal engaging portions 236A and 235a respectively defined at the periphery of the opening of the cassette accommodating room R whereby the cassette accommodating room R is airtightly sealed by the stocker casing 200 and is permitted to be independent cassette accommodating room R.

Accordingly, air in the cassette accommodating room R is replaced by an exterior atmosphere whenever the cassette is taken in and out, however, the cassette accommodating room R and the gas passages 237A to 237C are airtightly sealed by the exterior atmosphere so that the cassette accommodating room R and the gas passages 237A to 237C are maintained at the same concentration of $N_2$ gas. The movable frame 221 is returned to its original position by resilient forth of the bellows.

Since the discharge ports 232A of the supporting shaft 232 are gradually expanded in the descending order, if the ratio of the opening sectional of the discharge port 223A is appropriately determined, the amount of gas to be flown in each cassette accommodating room R is the same and the concentration of $N_2$ gas in each cassette accommodating room R can be fixed.

Since the discharge ports 241C are defined adjacent to the bearing 242 of the fixed shaft 241, the dust around the bearing 242 is drawn from the discharge port 241C to the fixed shaft 241 and discharged from the gas discharge port 214 while the dust generated around the gear 243 and the pinion 244 is discharged from the discharge port 241D of the fixed shaft 241.

Since the position sensor 250 is provided according to the invention, the cassette accommodating room R can be positioned at the position where the cassette can be surely taken in and out.

Although the door body 222 is openable by the operator, it is frequently openable by a loading robot or a conveying robot which moves between manufacturing lines. It is preferable to use $N_2$ gas discharged outside the clean room by permitting such $N_2$ gas to be recycled in the stocker casing 200.

With the arrangement of the third embodiment, since the door unit seals the wafer airtight keeping unit from the external atmosphere excepting the cassette accommodating room R which is positioned at the portion where the cassette is taken in and out, the concentration of the cassette accommodating room R, which is positioned at the portion where the cassette is taken in and out, is not varied, so that there is no likelihood that the turbulence is generated in the stocker casing 200. Accordingly, it is possible to restrict the oxide film from growing on the surface of the semiconductor wafer caused by spontaneous oxidation and prevent dust, etc. from attaching thereto. Accordingly, it is possible to improve the manufacturing yield compared with the conventional one.

What is claimed is:

1. A wafer keeping facility comprising:
a wafer keeping box which includes wafer keeping shelves having filters at rear portions thereof, a loading apparatus having a vertically movable loading mechanism which is mounted thereon and travels along a rail disposed on a front passage before the wafer keeping shelves, a fluid circulating device for causing an inert gas to flow through the filters to the rear portion of the wafer keeping shelves and then to the front passage, and exhaust outlets;
first and second path boxes provided at taking-in-and-out outlet of the wafer keeping box;
a gas reservoir for storing a quantity of the inert gas therein;
a first gas supply pipe having a first valve, the first gas supply pipe extending from the gas reservoir toward the first pass box;
a second gas supply pipe having a second valve, the second gas supply pipe extending from the gas reservoir toward the second pass box; and
a fluid control device.

2. A wafer keeping facility according to claim 1, wherein the first and second valves are respectively ON/OFF valves and are controlled under a time schedule by the fluid control device.

3. A wafer keeping facility according to claim 1, further comprising an oxide concentration meter for measuring an oxide concentration in the wafer keeping box, and wherein the fluid control device controls the degree of opening of the first valve depending on the measuring value of the oxide concentration and a prescribed value.

4. A wafer keeping facility according to claim 1, wherein the wafer keeping box has a double structured wall which contains a space and surrounds a wafer keeping room provided with the wafer keeping shelves, in which the wafer keeping room has a filter wall at a ceiling thereof and a suction arrangement at the bottom thereof, and the space serves as a circulating passage for inert gas flowing from the suction arrangement to the filter wall.

5. A wafer airtight keeping unit, comprising: a plurality of partitioned shelves to which semiconductor wafers are taken in and out, each of the partitioned shelves including a box which has an opening at a front thereof and which contains a wafer accommodating room adjacent first and second filters, a fluid supply passage and a fluid discharge passage which respectively communicate through the first and second filters with the wafer accommodating room, and a door which can airtightly shut the opening of the partitioned shelf and is closable by a closable mechanism, wherein the fluid supply passage is connected to an end of a gas supply pipe to which inert gas is supplied from an exterior fluid reservoir, and the fluid discharge passage communicates with a gas discharge pipe.

6. A wafer airtight keeping unit according to claim 5, wherein the door has an automatic locking mechanism capable of locking thereof.

7. A wafer airtight keeping unit, comprising a cylindrical stocker casing having openings at upper and lower portions thereof and a $N_2$ gas purge space in an inner space thereof, rotary stocker bodies which are partitioned and housed in the stocker casing, a gas passage defined between an inner wall of the stocker casing and the $N_2$ gas purge space, a rotary mechanism for rotatively driving the stocker bodies, a position sensor for detecting the rotary position of the stocker bodies, an air supply chamber for introducing $N_2$ gas into the stocker casing through a filter covering the upper opening of the stocker casing, and an air discharge unit communicating with a discharge port defined at the lower opening of the stocker casing;

wherein the stocker bodies are arranged circularly around a hollow supporting shaft which has a closed upper end and a lower end open toward the air discharge port, each stocker body being open toward the gas passage and having a plurality of cassette accommodating rooms which are arranged in plural vertical stages and communicate through the hollow supporting shaft with the discharge port;

wherein the stocker casing has a respective cassette taking-in-and-out-port defined for each vertical stage of the stocker bodies and a respective door unit for airtightly shutting each said cassette taking-in-and-out port;

wherein the position sensor issues a door opening permission signal when one of the stocker bodies is in a predetermined position where the cassette accommodating rooms therein each confront a respective one of the cassette taking-in-and-out ports; and wherein each of the door units seals airtightly the associated cassette accommodating room from other portions of the stocker casing when it is open.

8. A wafer airtight keeping unit according to claim 7, wherein sectional areas of the air discharge ports of the cassette accommodating rooms increase progressively in size in a downward direction.

9. A wafer airtight keeping unit according to claim 7, wherein each door unit includes a movable frame which is disposed in a respective one of the cassette taking-in-and-out ports and is slidable in a radial direction of the stocker casing, a door body which has a lever portion engaged with outer surface side ends of the movable frame at one side thereof and which is turnably supported by the stocker casing, and a bellows for effecting a seal between the cassette taking-in-and-out port and the movable frame, wherein an inner end portion of the movable frame is airtightly engaged with a seal portion defined at an end periphery of the associated cassette accommodating room when the door unit is open.

10. A wafer airtight keeping unit according to claim 9, wherein each of the bellows has a spring function and serves as a returning mechanism for the movable frame engaged thereby.

11. A wafer airtight keeping unit according to claim 7, wherein the hollow supporting cylinder of the stocker body is provided coaxially with a rotary table which has a central hole, the rotary table being supported by a fixed hollow shaft which covers the air discharge unit and extends from the bottom of the stocker casing to the inside of the hollow supporting cylinder by way of a bearing, the fixed hollow shaft having a radially directed port which opens into the hollow supporting shaft and a radially directed discharge port which opens under the rotary table.

12. A wafer keeping facility according to claim 1, wherein the fluid control device controls the flow of inert gas from the gas reservoir to the first and second gas supply pipes and to the wafer keeping box.

* * * * *